United States Patent
Kamiya et al.

(10) Patent No.: US 7,524,559 B2
(45) Date of Patent: *Apr. 28, 2009

(54) RESIN PARTICLE, CONDUCTIVE PARTICLE, AND ANISOTROPIC CONDUCTIVE ADHESIVE CONTAINING THE SAME

(75) Inventors: Kazunobu Kamiya, Tochigi (JP); Ryoji Kojima, Tochigi (JP)

(73) Assignee: Sony Chemical & Information Device Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 11/800,831

(22) Filed: May 8, 2007

(65) Prior Publication Data

US 2007/0299159 A1    Dec. 27, 2007

Related U.S. Application Data (63) Continuation of application No. 10/517,076, filed as application No. PCT/JP03/07185 on Jun. 6, 2003.

(30) Foreign Application Priority Data

Jun. 6, 2002    (JP) ............................. 2002-165439

(51) Int. Cl.
*B32B 5/66*    (2006.01)

(52) U.S. Cl. ........................ 428/402; 428/407; 427/212; 427/213.3; 427/213.31; 264/5; 264/10

(58) Field of Classification Search ................. 428/403, 428/404, 405, 406, 407, 402; 427/212, 213.3, 427/213.31; 264/5, 10
See application file for complete search history.

(56) References Cited

FOREIGN PATENT DOCUMENTS

| JP | 06-001854 |   | 1/1994 |
|----|-----------|---|--------|
| JP | 08-113654 |   | 5/1996 |
| JP | 09-185069 |   | 7/1997 |
| JP | 10-259253 |   | 9/1998 |
| JP | 11-073817 | * | 3/1999 |
| JP | 2000-053710 | * | 2/2000 |
| JP | 2000-319309 |   | 11/2000 |

* cited by examiner

*Primary Examiner*—Leszek Kiliman
(74) *Attorney, Agent, or Firm*—Gerald T. Shekleton (57) ABSTRACT

Resin particles comprised of an acrylic resin. Not only is the maximum compression deformation ratio thereof as great as 60% or more but also the load required for 60% compression deformation is as small as 60 mN or less. Wiring boards are therefore coupled in using an anisotropic conductive adhesive obtained by first manufacturing conductive particles having a conductive coating formed on a resin particle surface of the resin particles by adhering a conductive material to the surface of the above resin particles as a core. On dispersing the conductive particles in an adhesive material, the conductive particles sandwiched between metallic wires of the wiring boards are greatly deformed by a small load, so that the electrical devices having a high conduction reliability can be obtained.

3 Claims, 6 Drawing Sheets

RESIN PARTICLE, CONDUCTIVE PARTICLE, AND ANISOTROPIC CONDUCTIVE ADHESIVE CONTAINING THE SAME

This application is a continuation of U.S. patent application Ser. No. 10/517,076, filed Apr. 26, 2005, which is based on International Application No. PCT/JP03/07185 filed Jun. 6, 2003.

TECHNICAL FIELD

This invention relates to a resin particle and a conductive particle containing the resin particle as a core material thereof and further to an anisotropic conductive adhesive containing the conductive particles.

BACKGROUND ART

Conventionally, an anisotropic conductive adhesive in which conductive particles are dispersed within an adhesive material has been widely used in coupling or assembling semiconductor devices, wiring boards, or the like.

Figure 1A:
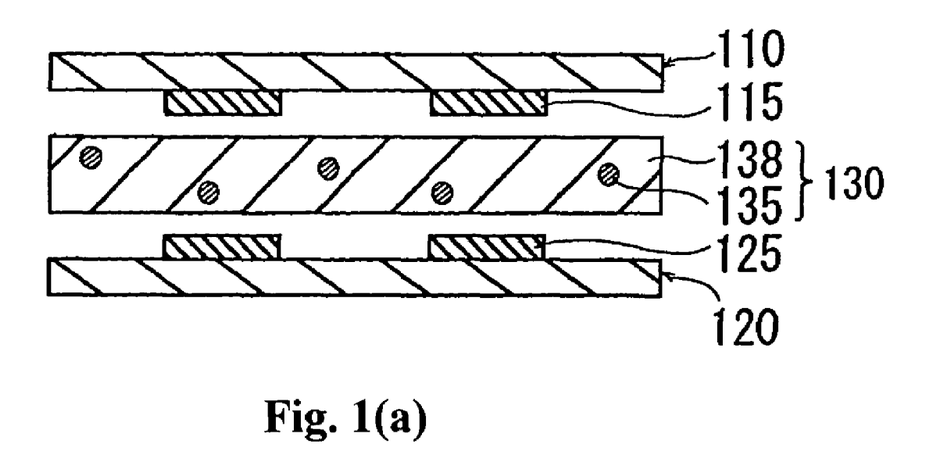
FIG. 1(a) is an illustration of a prior art process for coupling wiring boards by means of anisotropic conductive adhesive with use of conductive particles which shows a state before heating pressure.

Situations where two wiring boards are coupled in using the anisotropic conductive adhesive of the conventional art will be explained. FIG. 1(a) is an illustration of a process for coupling a wiring board 110 and a wiring board 120 to each other by means of the anisotropic conductive adhesive with use of the conductive particles, showing as a state prior to pressuring with heating. After rendering a metallic wiring 115 of the wiring board 110 and a metallic wiring 125 of the wiring board 120 face to each other, an anisotropic conductive adhesive 130 is sandwiched between surfaces of the wiring board 110, 120, having the metallic wiring 115,125, respectively.

Figure 1B:
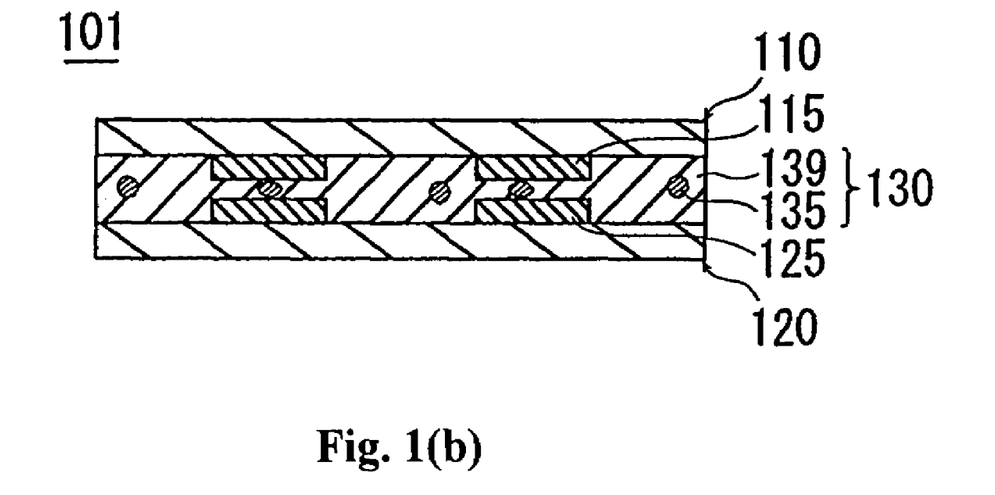
FIG. 1(b) is an illustration of a prior art process for coupling wiring boards by means of anisotropic conductive adhesive with use of conductive particles which shows a state after the heating pressure.

Upon heating to press the entire portions in the above condition, an adhesive material 138 in the anisotropic conductive 130 is softened by heating, while by pressing, the metallic wirings 115, 125 push away the softened adhesive material 138, so that conductive particles 135 dispersed within the adhesive material 138 are sandwiched between the metallic wirings 115,125.

Where heating is further continued, the adhesive material 138 is hardened in a state while the conductive particles 135 are sandwiched between the metallic wirings 115, 125, and therefore, an electric device 101 as shown in FIG. 1(b) can be obtained. In the electric device 101, the two wiring boards 110 120 are coupled to each other not only mechanically by the hardened adhesive material 139 but also electrically through the conductive particles 135.

Meanwhile, it has been known that in using conductive particles having high compression deformation ratio as the conductive particles 135, the conduction reliability is improved since a process of heating with pressure compresses and deforms the conductive particles to enlarge the contact area between the conductive particles and the metallic wirings.

Publicly known as such a particle is a conductive particle in which a conductive coating is formed on a surface of a core particle comprised of a resin particle (see, e.g., Japanese Patent Application Publication No. JA-11-73817). The resin particle used for the core particle is formed by a condensation method for condensing resin particles having a small size or sizes, or y a seed polymerization method for growing seed particles by emulsion polymerization, so that such a resin particle has the high compression deformation ratio, thereby increasing the compression deformation ratio of the conductive particles, as a whole.

Even such a conductive particle, however, does not have the sufficient compression deformation ratio, and the conductive particles may be broken down when the pressing load is made larger to increase the deformation amount.

SUMMARY OF THE INVENTION

The present invention is invented to solve inconvenience in such conventional arts, and it is an object of the present invention to provide a conductive particle having a sufficient compression deformation ratio by providing a resin particle deformed greatly by a small load. It is another object of the present invention to provide an anisotropic conductive adhesive having a large contact area between the conductive particles and metallic wirings as to be superior in conduction reliability.

As the result of intensive researches done by the inventors of the present invention, it has been found out that where the resin particle defined as the core particle is one compressed as deformed by 60% or more, the deformation amount of the entire conductive particle sufficiently increases, so the conduction reliability of the electric device is improved.

If a load necessary for compression is large even where the maximum compression deformation ratio is high, it may cause an adhered body to receive damages. The inventors of the present invention have carried out further intensive researches and, as a result of the researches, it has been found that where the load necessary for deformation of the resin particle by 60% is less than or equal to 60 mN, the adhered body does not receive damages when heated and pressurized.

The present invention has been accomplished on the basis of the above findings. That is, the resin particle according to the present invention is characterized in that a main component thereof is an acrylic resin; the maximum compression deformation ratio is 60% or more; and the load necessary for compression deformation by 60% is less than or equal to 60 mN.

The resin particle according to the present invention not only has a great maximum compression deformation ratio as very large as 60% or more but also requires a load for 60% deformation as very small as less than or equal to 60 mN. The resin particle having such a characteristic as the above is formed by forcing treatment liquid containing acrylic monomers into a medium liquid with pressure via a porous membrane to form droplets of the treatment liquid in the medium liquid, and thereafter by hardening the treatment liquid composing the droplet.

The conductive particle according to the present invention is characterized in that a main component is an acrylic resin; the maximum compression deformation ratio of the conductive particle is 60% or more; and a conductive material is bonded to the resin particle having the load necessary for 60% compression deformation less than or equal to 60 mN, and further the anisotropic conductive adhesive according to the present invention is characterized in being formed by dispersing the above conductive particles within an adhesive material.

In the conductive particle according to the present invention, a conductive layer is formed by, e.g., adhering the conductive material to a surface of the resin particle as described above, and such conductive particles are dispersed at a predetermined proportion in the adhesive material to manufacture the anisotropic conductive adhesive, and when the above anisotropic conductive adhesive is used for carrying out coupling of wiring boards, the electric device enjoying a high conductive reliability can be obtained because the conductive particles sandwiched by the wiring boards are greatly compressed as deformed by a small load and also because the resin particle in the conductive particle is not broken down in a case of compressed and deformed by 60%.

BEST MODE FOR CARRYING OUT THE INVENTION

Hereinafter, a resin particle, a conductive particle, and an anisotropic conductive adhesive under application of the present invention will be described in detail with reference to the figures.

First, in the resin particle according to the present invention, a main component is an acrylic resin; the maximum compression deformation ratio of the resin particle is 60% or more; and a load necessary for compression deformation is less than or equal to 60 mN. It is especially preferable that the load necessary for the compression deformation is less than or equal to 30 mN.

It is to be noted that the compression deformation ratio according to the present invention is defined as a value represented by the following formula (1) on the condition that a particle size (initial particle size) of the resin particle before exertion of the load is set to $R_0$ while a particle size thereof at a time exerting the load is set to $R_1$ where the resin particle is, based on a micro pressure test, compressed and deformed upon exertion of the load under the condition of 2.65 mN/second.

$$(R_0-R_1)/R_0 \times 100 = \text{Compression Deformation Ratio}(\%) \qquad (1)$$

The maximum compression deformation ratio means the compression deformation ratio measured when the load is exerted, according to the above micro test, until that the resin particles reach breakdown.

The acrylic resin composing the resin particle according to the present invention is composed of a polymer of acrylic monomers, e.g., a polymer of monomers containing one or more urethane compounds and acrylic acid esters.

The acrylic monomer, herein, indicates both of the acrylic acid ester (an acrylate) and a methacrylic acid ester (a methacrylate). In the present invention, the monomer includes an oligomer defined as a polymer of two or more monomers on condition of polymerized upon, e.g., heated or exposed to ultraviolet radiation.

Where the acrylic resin composing the resin particle according to the present invention is composed of the polymer of monomers containing the urethane compound and the acrylic acid ester, it is preferable to contain in proportion to 100 parts by weight of the monomer, 5 or more parts by weight of the urethane compound, and further 25 parts or more by weight of the urethane compound is more preferable.

A polyfunctional urethane acrylate such as, e.g., a bifunctional acid can be used as the urethane compound.

The resin particle according to the present invention is formed by forcing to enter treatment liquid containing monomers with pressure into medium liquid via a porous membrane to form droplets of the treatment liquid in the medium liquid, and by thereafter hardening the treatment liquid composing the droplets.

No conventional acrylic resin particle as manufactured by means of the above described condensation method or a seed polymerization method, has the maximum compression deformation ratio of 60% or higher.

To the contrary, the resin particle having the maximum compression deformation ratio of 60% or more is obtainable when the droplets are hardened upon polymerizing the acrylic monomers in the droplet after forming the droplets of the treatment liquid by means of, i.e., an emulsification process in which the treatment liquid is forced into the medium liquid with pressure via the porous membrane.

With this membrane emulsification process, the particle size of the resin particle changes depending on fine hole sizes of the porous membrane, so that the resin particles having a unified particle size profile can be obtained when using, as the porous membrane, a membrane having a narrow fine hole profile, such as, e.g., a SPG (Shirasu Porous Glass) membrane.

Figure 2:
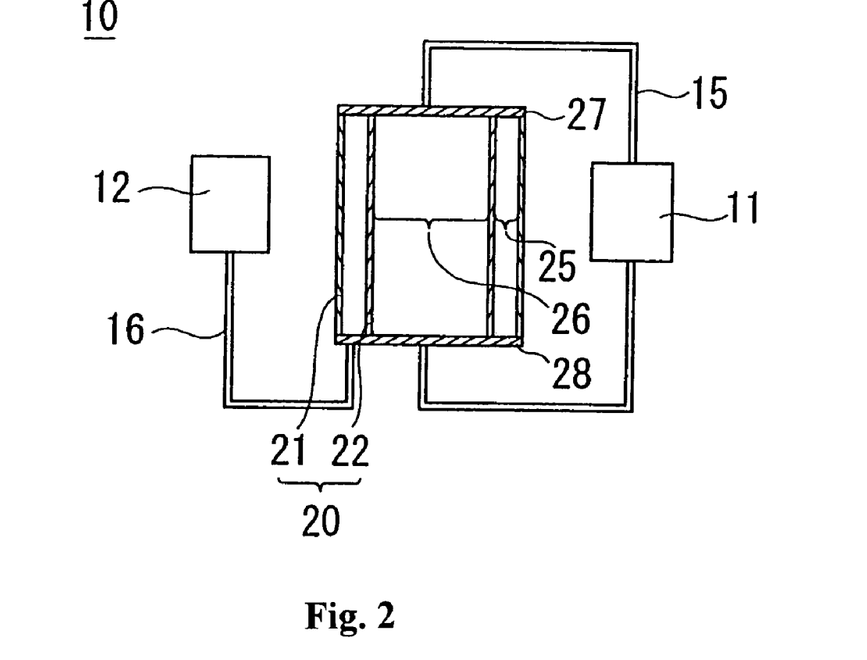
FIG. 2 is a cross-sectional view showing an example of an emulsion device used for the present invention.

An example of a process for manufacturing the resin particle according to the present invention is hereinafter described in detail FIG. 2 shows an emulsion device 10 used for the present invention. The emulsion device 10 has an emulsion tank 20, a medium liquid tank 11, and a treatment liquid tank 12.

Figure 3:
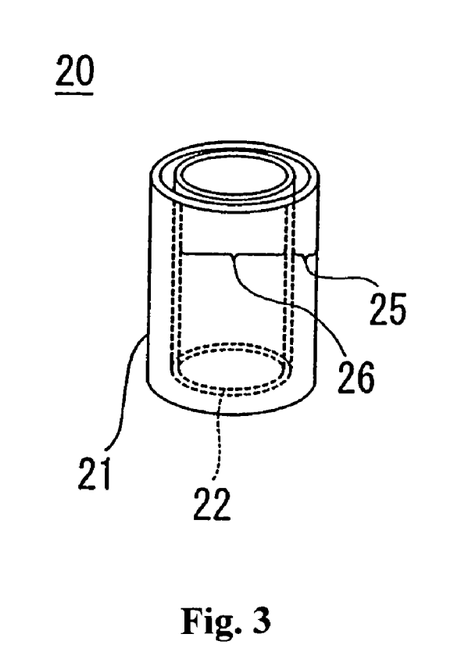
FIG. 3 is a perspective view illustrating an emulsion tank.

FIG. 3 shows the emulsion tank 20 having an external tube 21 and an internal tube 22 in a cylindrical form respectively. External diameter size of the internal tube 22 is smaller than internal diameter size of the external tube 21, so that the internal tube 22 is inserted into the external tube 21 with a gap.

Figure 4:
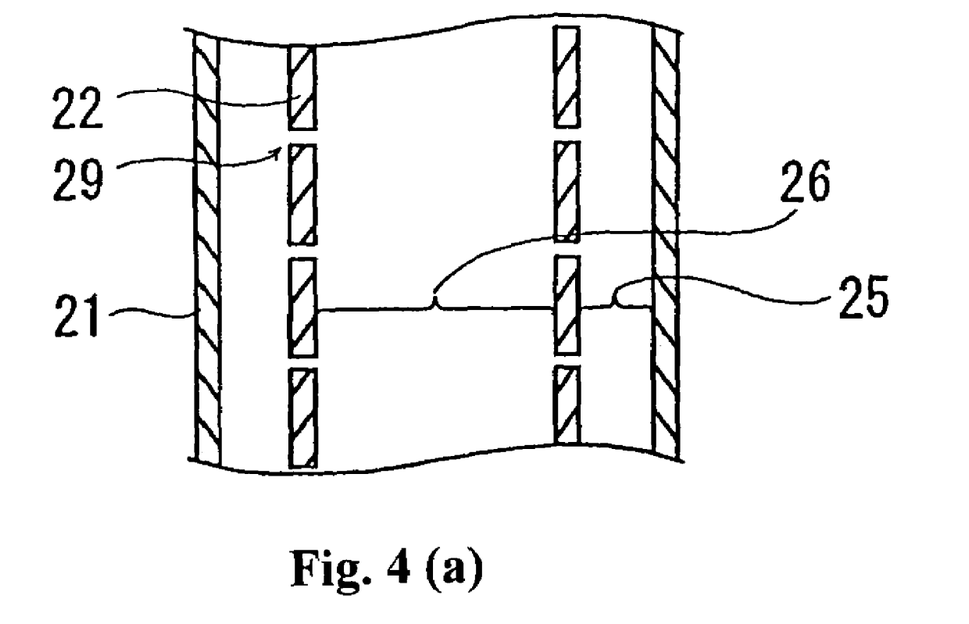
FIG. 4(a) is an illustration showing a process for forming liquid emulsion which shows a state before the supply of the treatment liquid.
FIG. 4(b) is an illustration showing a process for forming liquid emulsion which shows a state after the supply of the treatment liquid.

As shown in FIG. 4(a), the internal tube 22 is composed of the porous membrane (herein defined as SPG membrane) molded in a cylindrical form, and the gap between the internal tube 22 and the external tube 21 is coupled to the interior space of the internal tube 22 via fine holes 29 of the porous membrane.

In FIG. 4(a), it is to be noted that the numeral 25 indicates the first space composed of the gap between the external tube 21 and the internal tube 22 while the numeral 26 indicates the second space composed of the interior space of the internal tube 22.

As shown in FIG. 2, the emulsion tank 20 is equipped with an upper lid 27 for closing upper ends of the external tube 21 and the internal tube 22 as well as an lower lid 28 for closing lower ends of the external tube 21 and the internal tube 22, and the first space 25 and the second space 26 are respectively sealed with those upper lid 27 and lower lid 28.

The medium liquid tank 11 is coupled to the upper lid 27 and the lower lid 28 by a pipe arrangement 15, and the treatment liquid tank 12 is coupled to the lower lid 28 by a pipe arrangement 16.

Where liquid is brought in the medium liquid tank 11 and a circulating pump of the medium liquid tank 11 is started, the liquid disposed in the medium tank 11 is to be circulated inside the second space 26. On the other hand, where liquid is brought in the treatment liquid tank 12 and the liquid in the treatment liquid tank 12 is squeezed out by nitrogen gas pressure, the liquid is supplied into the first space 25.

When the resin particle is formed upon using the emulsion device 10, the treatment liquid composed of the monomer (herein, a mixture of the urethane acrylate as the urethane compound and the acrylic acid ester) having a low wettability with respect to the porous membrane, is supplied in the treatment liquid tank 12 while the medium liquid is supplied, in which a dispersion stabilizer is added to solution (herein, water), having a higher wettability with respect to the porous membrane than the acrylic monomer.

The medium liquid in the medium liquid tank 11 is subsequently circulated while the treatment liquid in the treatment liquid tank 12 is supplied into the first space 25.

FIG. 4(b) shows a state where a treatment liquid 32 is supplied into the first space 25 while a medium liquid 31 is circulated inside the second space 26.

If the pressure of the treatment liquid 32 inside the first space 25 is made higher than that of the medium liquid 31 circulating inside the second space 26, the treatment liquid 32 passes through the fine holes 29 to be introduced into the second space 26 with pressure, and thus droplets 33 composed of the treatment liquid 33 are formed by dispersing the treatment liquid 32 which moves through the fine holes 29 within the medium liquid 31 flowing inside the second space 26.

When the droplets 33 at the prescribed density are formed in the medium liquid 31, the circulation of the medium liquid 31 as well as the supply of the treatment liquid 32 are stopped, and the medium liquid 31 is then taken out of the emulsion device 10.

Figure 5:
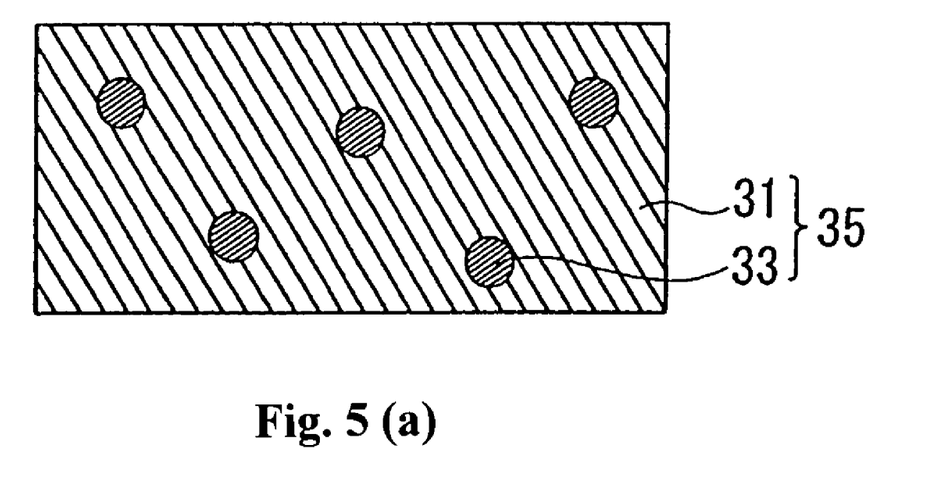
FIG. 5(a) is an illustration of a process for forming resin particles which shows a state of droplet formation.
FIG. 5(b) is an illustration of a process for forming resin particles which shows a state of droplet effect.

Numeral 35 in FIG. 5(a) indicates liquid emulsion formed by the formation of the droplets dispersed with a prescribed density in the medium liquid 31.

The treatment liquid, herein is preliminarily added with polymerization initiator for promoting the polymerization of the monomers by heating, and where the liquid emulsion 35 is heated, the monomers contained in the droplet 33 are polymerized to harden the droplet 33, thereby forming the resin particles 30 composed of the polymer of the monomers as shown in FIG. 5(b).

Since this resin particle 30 is formed by means of the membrane emulsification process such as described the above, the particle size profile thereof is uniform. Furthermore, in the resin particle formed by means of the membrane emulsification process with use of the urethane compound and the acrylic acid ester, the maximum compression deformation ratio is as extremely large as 60% while the load necessary for the deformation is as low as less than or equal to 60 mN.

In the above, explained is the case where the treatment liquid 32 is supplied into the first space 25 locating outside the internal tube 22 to be introduced into the second space 26 with pressure from the first space 25, but the present invention is not limited to the above case, and the treatment liquid, for example, can be supplied into the second space 26 inside the internal tube 22 to be introduced into the first space 25 outside the internal tube 22 with pressure from the second space 26.

The porous membrane is also not limited to the SPG membrane, so various porous ceramic membranes or an organic porous membrane such as, e.g., a PTFE (polytetrafluoroethylene) membrane can be used.

The shape of the external tube 21 or the porous membrane is not limited to be cylindrical, so that those in various shapes such as, e.g., a prismatic shape can be used.

The polymerization initiator to be added to the treatment liquid is not limited particularly, so various types such as, e.g., a lauroyle peroxide, 1,1,3,3-tetramethylbutyl peroxide-2-ethylhexanate, tert-hexylperoxy-2-ethylhexanate, tert-butylperoxy-2-ethylhexanate, 2,2'-azobis(2-methylbutyronitril), or 2,2'-azobis (2,4-dimethylvaleronitrile) can be used.

Although explained is the case in the above in which water is used as the main component of the medium liquid, the main component is not limited to that, so various types of hydrophilic solution having a higher hydrophilic than that of the acrylic monomer, can be used.

A polymer dispersion stabilizer to be added to the medium liquid is also not limited to a polyvinyl alcohol, so various types such as, e.g., a polyviniyl pyrrolidone, a polyvinyl acetamide, or a polyvinyl alkylether can be used The addition amount of the polymer dispersion stabilizer is particularly not limited but preferably, not less than 0.3, nor more than 1.0 part by weight per 100 parts by weight of the medium liquid.

Although explained already is the case in which the acrylic monomers in the droplet 33 are polymerized upon heated, the present invention is not limited to this, so that the acrylic monomers in the droplet 33 can be polymerized by means of ultraviolet rays on a condition that photo polymerization is preliminarily added to the treatment liquid.

Figure 6:
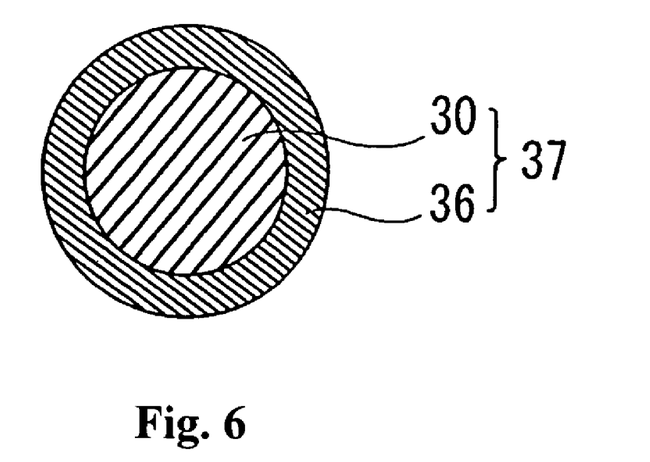
FIG. 6 is an illustration showing an example of a conductive particle according to the present invention.

A conductive particle 37 as shown in FIG. 6 can be obtained by forming a conductive layer 36 upon bonding a metallic material as conductive material to a surface of the resin particle 30 manufactured with the above described process.

It is to be noted that the conductive material to be bonded to the surface of the resin particle is not limited to metal, and various types of materials such as, e.g., carbon, can be used. Furthermore, a method for bonding the conductive material is not limited in particular.

Use for the resin particle according to the present invention is not limited to the conductive particle, and the resin particle; for example, is added as it is to adhesive, thereby being usable as a spacer particle or a filler for back coating material.

The anisotropic conductive adhesive using this conductive particle 37 is described next. For manufacturing such an anisotropic conductive adhesive, the adhesive material in a paste form is first manufactured by mixing an epoxy resin as a thermosetting resin, a hardener for hardening the epoxy resin, and an organic solvent.

Figure 7:
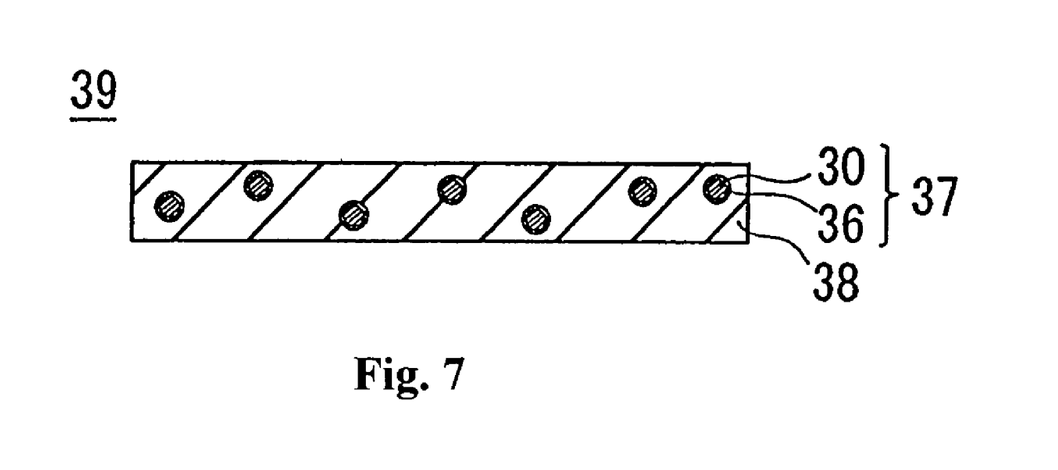
FIG. 7 is an illustration of an example of an anisotropic conductive adhesive using conductive particles according to the present invention.

The anisotropic conductive adhesive is subsequently molded in a film form after the anisotropic conductive adhesive in the paste form is produced by dispersing the conductive particles 37 in the adhesive material. Numeral 39 in FIG. 7 shows an adhesive film composed of the anisotropic conductive adhesive molded in a film form.

A process for producing an electric device by using the adhesive film 39 is next explained.

Figure 8:
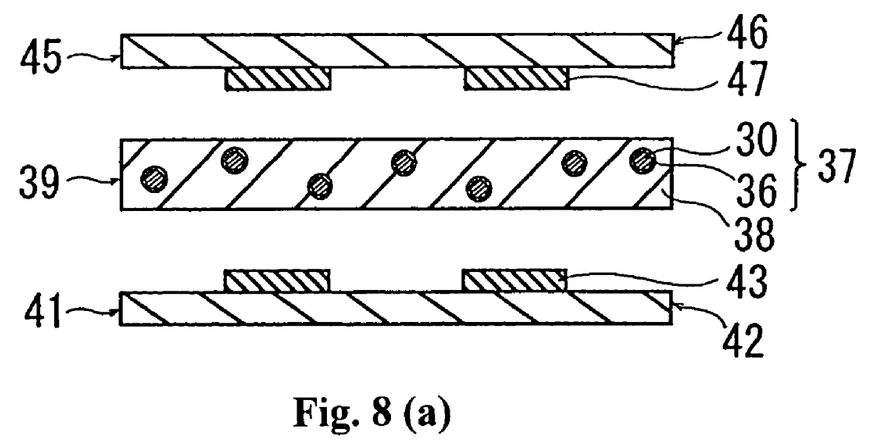
FIG. 8(a) is an illustration of a process for coupling wiring boards using anisotropic conductive adhesive which shows a state before the heating press.
FIG. 8(b) is an illustration of a process for coupling wiring boards using anisotropic conductive adhesive which shows a state after the heating press.
FIG. 8(c) is an illustration of a process for coupling wiring boards using anisotropic conductive adhesive which shows an electric device where two wiring boards are coupled to each other by means of a hardened adhesive material.

Numerals 41 and numeral 45 in FIG. 8(*a*) indicate wiring boards, respectively. The wiring board 41 has a board 42 and a metallic wiring 43 formed on one side of the metallic wiring 42 while a wiring board 45 has a board 46 and a metallic wiring 47 formed on one side of the metallic wiring 46.

After the sides of the wiring board 41, 45 formed with the metallic wirings 43, 47, respectively is made to face to each other, and after the above described adhesive film is disposed between the wiring boards 41, 45 to arrange the metallic wirings 43, 47 to face to each other by positional alignment, the above described adhesive film 39 is sandwiched between the two wiring boards 41, 45.

Where the wiring boards 41, 45 are heated with pressure in the above state, the adhesive material 38 in the adhesive film 39 is softened by heating, and in application of pressure, the metallic wirings 43, 47 are pushed away the softened adhesive material 38, thereby sandwiching between the metallic wiring 43, 47 (FIG. 8(*b*)) the conductive particles 37 dispersed in the adhesive material 38.

Because the resin particle 30 as the core of the conductive particle 37 not only has the maximum compression deformation ratio of 60% or more as exceedingly great but also is compressed and deformed by up to 60% with a small load less than or equal to 60 mN, the conductive particles 37 sandwiched between the metallic wirings 43, 47 are greatly deformed even with a small load, thereby enlarging exceedingly the contact area between the conductive particles 37 and the metallic wrings 43, 47.

With further heating, the thermosetting resin is polymerized to harden the adhesive material 38 as the conductive particles 37 are sandwiched between the metallic wirings 43, 47, and the hardened adhesive material 38 immobilizes the wiring boards 41, 45.

Numeral 40 in FIG. 8(*c*) shows an electric device in which the two wiring boards 41, 45, are coupled with the hardened adhesive material 49. In this electric device 40, the wiring boards 41, 45 are coupled to each other not only mechanically by the hardened adhesive material 49 but also electrically through the conductive particles 37.

This electric device 40 furthermore has a high conductive reliability because of the large contact area between the conductive particles 37, and the metallic wirings 43, 47.

Hereinafter, specific Embodiments of the present invention are explained based on the experimental results.

EMBODIMENT A

Acrylic monomer compositions of ten kinds containing, as a monomer, acrylic acid ester and polyfunctional urethane acrylate as a urethane compound having three or more acroyl groups were prepared, and a surfactant (Product name: Nonion S, manufactured by Nippon Oil & Fat Corp.) of 0.05 part by weight and a peroxide polymerization initiator (Product name: Peroyl L, manufactured by Nippon Oil & Fat Corp.) of 1 part by weight, were added to each acrylic monomer of 100 parts by weight and mixed to prepare the treatment liquid.

The medium liquid was subsequently prepared by adding and mixing the polyvinyl alcohol (Product name: PVA-205, manufactured by Kuraray Co, Ltd. of 10 parts by weight ) as the polymer dispersion stabilizer, a sodium dodecylbenzenesulfonate (Product name: New Lex R, manufactured by Nippon Oil & Fat Corp.) of 0.8 part by weight as the surfactant, and a sodium sulfate of 1.2 parts by weight to 1450 parts by weight of aqua distillate.

After forming a liquid emulsion with the membrane emulsification process upon using the above treatment liquid and medium liquid, the liquid emulsion was heated to polymerize the acrylic monomers in the droplets, and thus the resin particles of about 5 microns in diameter are obtained (Embodiments A1 to A8, and Comparative Examples a1 and a2).

The acrylic monomer composition of three kinds containing a trifunctional acrylate and a bifunctional acrylate as monomers were provided similarly to produce, with using those acrylic monomer compositions, the resin particles according to Embodiment A9, A10, and Comparative Example a3.

Composition of each acrylic monomer composition is described in Table 1 below.

TABLE 1

Table 1: Monomer Composition and Measurement Result

| Monomer Compression | Compression Load (mN) | Compression Displacement (μm) | Particle Size (μm) | Compression Deformation Ratio (%) | Load Value at the Time of Compression Ratio of 60% (mN) | Membrane Emulsion Tendency | |
|---|---|---|---|---|---|---|---|
| U-4H:A-HD = 15:85 | 57.05 | 3.35 | 5.57 | 60 | 55.4 | A | Embodiment A1 |
| U-4H:A-HD = 25:75 | 56.12 | 3.56 | 5.85 | 61 | 50.4 | A | Embodiment A2 |
| U-4H:A-HD = 35:65 | 45.17 | 3.24 | 5.36 | 60 | 41.7 | B | Embodiment A3 |
| UN3320HB = -HD:4:96 | 40.53 | 3.10 | 5.31 | 58 | — | C | Comparative Example a1 |
| UN3320HB = -HD:5:95 | — | — | — | 58 | — | C | Comparative Example a2 |
| UN3320HB = -HD:8:92 | 69.35 | 3.65 | 5.39 | 68 | 37.3 | A | Embodiment A4 |
| UN3320HB = -HD:10:90 | — | — | — | 68 | 37.3 | B | Embodiment A5 |
| UN3320HB = -HD:12:88 | 52.02 | 3.38 | 5.61 | 60 | 49.2 | B | Embodiment A6 |
| UN3320HB = -HD:15:85 | — | — | — | 60 | 49.2 | B | Embodiment A7 |
| UN3320HB = -HD:8:92 | 54.56 | 3.27 | 5.13 | 64 | 40.0 | A | Embodiment A8 |
| isocyanurate:A-HD = 5:95 | 45.81 | 3.40 | 5.63 | 60 | 43.8 | A | Embodiment A9 |
| isocyanurate:A-HD = 10:90 | 46.47 | 3.35 | 5.38 | 62 | 39.7 | A | Embodiment A10 |
| isocyanurate:A-HD = 20:80 | — | — | — | — | — | B | Comparative Example a3 |

\* Ratios of the monomer compositions in the above Table are weight ratios of respective monomers.

Herein, it is to be noted that a tetrafunctional urethane acrylate (Product name: U-4H, manufactured by Shin-Nakamura Chemical Co., Ltd.), a hexafunctional urethane acrylate (Product name: UN3320HB, manufactured by Negami Chemical Industrial Co., Ltd.), and a hexafuctional urethane acrylate (Product name: UN3320HC, manufactured by Negami Chemical Industrial Co., Ltd.) were used as the polyfunctional urethane acrylate.

As the acrylic acid ester, 1,6-hexanedioldiacrylate (Product name: A-HD, manufactured by Shin-Nakamura Chemical Co., Ltd.) serving as a bifunctional acrylic acid ester was used.

Furthermore, as a trifunctional acrylate, a tris(2-hydoroxyethyl)isocyanurate triacrylate (Product Name: SR-368, manufactured by Sartomer Company, Inc.) serving as the urethane compound having cyclic urethane bond was used.

Upon selecting the resin particles having particle size of about 5 microns from the resin particles according to the Embodiments, respectively, "Compression Load, Initiate Particle Size, Compression Displacement, Maximum Compression Deformation Ratio, and Load at a time of Compression Ratio of 60%" hereinafter described were measured based on the micro pressure test. Regarding the "Compression Load," a load at a time of breaking the resin particle was measured by exerting the load on condition of 2.65 mN/second to the resin particle until the resin particle breaks. Regarding the "Initial Particle Size," a particle size before exerting the load was measured. Regarding the "Compression Displacement," it was determined by subtracting a particle size at a time of breaking a resin particle from an initial particle size. Regarding the "Compression Deformation Ratio," compression ratio (maximum compression deformation ratio, % unit) at a time of breaking the resin particle was calculated based on values of the above initial particle size and the compression displacement. Regarding the "Load at a Time of Compression Ratio of 60%", the value was measured when the resin particle is compressed and deformed by 60% upon exerting a load on condition of 2.65 mN/second thereto.

Measured values are described in Table 1 above.

The resin particle having the uniform resin size profile obtained upon conducting the process for membrane emulsification without problems in the process of manufacturing the resin particles, was evaluated as "A"; the resin particle having irregular particle size profile since the particle size adjustment was difficult even though the treatment liquid could be emulsified, was evaluated as "B"; and the resin particle wherein the membrane emulsification could not be done or wherein particle size adjustment could not be done even where the membrane emulsification could be done, was evaluated as "C", and those are described in blanks of "Membrane Emulsion Tendency" in the Tables 1 to 3.

In Embodiments A1 to A8 containing the polyfunctional urethane acrylate of 8 or more parts by weight with respect to the acrylic monomer of 100 parts by weight, the maximum compression deformation ratio was of 60% or more while the load value at a time of the compression ratio of 60% was within a range not less than 30 mN and not more than 60 mN.

To the contrary, in Comparative Examples a1 and a2 containing the polyfunctional urethane acrylate less than or equal to 5 parts by weight with respect to the acrylic monomer of 100 parts by weight, the compression deformation ratio was as low as less than 60%, while the membrane emulsification was difficult.

In Embodiment A1 added with the polyfunctional urethane acrylate of 35 parts by weight with respect to the acrylic monomer of 100 parts by weight, the maximum compression deformation ratio was sufficiently great, but the treatment liquid could not be unified since mutual solubility between the polyfunctional urethane acrylate and the acrylic acid ester was not good in the manufacturing process.

It is thus turned out that the optimized amount of the polyfunctional urethane acrylate with respect to the acrylic monomer of 100 parts by weight is 8 or more and less than 35 parts by weigh.

In comparison between Embodiments A9, A10 and the Comparative Example a3 using the isocyanurate as the acrylic monomer, with the resin particles according to Embodiments A9, A10 having the addition amount of the isocyanurate of 5 or more and less than 20 parts by weight with respect to the acrylic monomer of 100 parts by weight, the membrane emulsification could be done without any problem in the manufacturing process, and the maximum compression deformation ratio exceeds 60%, whereas in Comparative Example a3 having the addition amount of the isocyanurate of 20 parts by weight, it is difficult to form the resin particles by the membrane emulsification process, so that the particle resins having equal particle sizes could not be obtained. It is thus turned out that the optimized amount of the isocyanurate with respect to the acrylic monomer of 100 parts by weight is 5 or more and less than 20 parts by weigh.

EMBODIMENT B

The resin particles according to Embodiments B1 to B4 and Comparative Example b1 were manufactured on the same condition as the above described in Embodiments A except use of a mixture, as the acrylic monomer composition, of the bifunctional urethane acrylate of 25 parts by weight (Product name: AH600, manufactured by Kyoeisha Chemical Co., Ltd.) as the urethane compound, composed of 2-hydroxy-3-phenoxypropyl acrylate and hexamethylene diisocyanate as an addition reaction product, and an acrylic monomer of another kind of 75 parts by weight.

Furthermore, as another Embodiment, the resin particle was manufactured with use of the acrylic monomer composition composed of the mixture (Product Name: IND, manufactured by Shin-Nakamura Chemical Co., Ltd.) of 1,9-nonanediol methacrylate of 15 parts by weight and 2-methyl-1,8-octhanediol dimethacrylate of 85 parts by weight, thereby making Embodiment B5.

Compositions of those acrylic monomer compositions are described in Table 2 below.

TABLE 2

Table 2: Monomer Composition and Measurement Result

| Monomer Compression | Compression Load (mN) | Compression Displacement (μm) | Particle Size (μm) | Compression Deformation Ratio (%) | Load Value at the Time of Compression Ratio of 60% (mN) | Membrane Emulsion Tendency | |
|---|---|---|---|---|---|---|---|
| AH600:A-HD = 25:75 | 45.36 | 3.49 | 5.33 | 66 | 31.4 | A | Embodiment B1 |
| AH600:(A-DOD:A-NPG) = 25:75 (15:85) | 47.86 | 3.38 | 5.08 | 67 | 32.1 | A | Embodiment B2 |
| AH600:(A-DOD:A-NPG) = 25:75 (25:75) | 56.66 | 3.16 | 5.10 | 62 | 49.0 | A | Embodiment B3 |
| AH600:(PTMGA-250:A-NPG) = 25:75 (15:85) | 48.68 | 3.61 | 5.44 | 66 | 32 | A | Embodiment B4 |
| AH600:(PTMGA-250:A-NPG) = 25:75 (25:75) | 43.89 | 2.91 | 5.20 | 56 | — | A | Comparative Example b1 |
| IND | 45.90 | 3.41 | 5.20 | 65 | 33.6 | A | Embodiment B5 |

* Ratios of the monomer compositions in the above Table are weight ratios of respective monomers.

Used here as an acrylic monomer of other kinds were 1,6-hexanediol diacrylate (Product Name: A-HD, manufactured by Shin-Nakamura Chemical Co., Ltd.), 1,10-decanediol diacrylate (Product Name: A-DOD, manufactured by Shin-Nakamura Chemical Co., Ltd.), neopentylglycol diacrylate (Product Name: A-NPG, manufactured by Shin-Nakamura Chemical Co., Ltd.), and polytetramethyleneglycol diacrylate (Product Name: PTMGA-250, manufactured by Kyoeisha Chemical Co., Ltd.) as the bifunctional acrylic acid ester.

In regarding the resin particles according to Embodiments B1 to B5 and the Comparative Example b1, "Compression Load," "Initiate Particle Size," "Compression Displacement," "Maximum Compression Deformation Ratio," and "Load at a Time of Compression Ratio of 60%" were measured to evaluate the membrane emulsification on the same condition as Embodiment A1 described above. Results of those are described in Table 2 above.

As apparent from Table 2 above, the resin particles according to the Embodiments B1 to B5 had the compression deformation ratio of 60% or more, and the load value at a time of the compression deformation ratio of 60% was in a range of 30 mN or more and less than 60 mN.

To the contrary, the resin particle according to Comparative Example b1 containing the polytetramethyleneglycol of 25 parts by weight with respect to the acrylic monomer of 100 parts by weight, the compression deformation ratio did not reach 60%. Because Embodiment B4 in which the containing amount of the polytetramethyleneglycol is 15 parts by weigh, indicated that the maximum compression ratio exceeded 60%, it is turned out that the preferable containing amount of the polytetramethyleneglycol per 100 parts by weight of the acrylic monomer is less than 25 parts by weight.

EMBODIMENT C

The resin particles according to Embodiments C1 to C7, and Comparative Examples c1, c2 were manufactured on the same condition as that in Embodiment A described above except use of, as the acrylic monomer composition, the acrylic monomer composition of nine kinds composed of either or both the acrylic acid ester having a linear chain structure of a long chain (nine or more carbon numbers) and the acrylic acid ester having a branching structure.

Composition of those acrylic monomer compositions were described in Table 3 below.

TABLE 3

Table 3: Monomer Composition and Measurement Result

| Monomer Compression | Compression Load (mN) | Compression Displacement (μm) | Particle Size (μm) | Compression Deformation Ratio (%) | Load Value at the Time of Compression Ratio of 60% (mN) | Membrane Emulsion Tendency | |
|---|---|---|---|---|---|---|---|
| A-DOD:A-NPG = 80:20 | — | — | — | — | — | C | Comparative Example c1 |
| A-DOD:A-NPG = 70:30 | 44.36 | 3.62 | 5.05 | 72 | 19.5 | A | Embodiment C1 |
| A-DOD:A-NPG = 60:40 | 48.93 | 2.85 | 5.18 | 53 | — | A | COMPARATIVE EXAMPLE c2 |
| PTMGA-250:A-TMPT = 7:3 | 32.09 | 3.17 | 5.10 | 62 | 28.0 | A | COMPARATIVE EXAMPLE c2 |
| PTMGA-250:A-TMPT = 6:4 | 36.25 | 3.24 | 5.03 | 64 | 27.5 | A | Embodiment C3 |
| PTMGA-250:A-TMPT = 5:5 | 51.91 | 3.63 | 5.65 | 64 | 37.8 | A | Embodiment C4 |
| PTMGA-250:A-TMPT = 4:6 | 43.20 | 3.26 | 5.35 | 61 | 41.7 | A | Embodiment C5 |
| A-HD | 41.24 | 3.32 | 5.00 | 66 | 27.1 | A | Embodiment C6 |
| A-IBD-2E | 34.26 | 3.33 | 5.18 | 64 | 24.4 | A | Embodiment C7 |

* Ratios of the monomer compositions in the above Table are weight ratios of respective monomers.

Used herein as the acrylic acid ester having the linear chain structure of the long chain were 1,10-decanediol diacrylate (Product Name: A-DOC, manufactured by Shin-Nakamura Chemical Co., Ltd.) as the bifunctional acrylic acid ester, the polytetramethyleneglycol diacrylate (Product Name: PTMGA-250, manufactured by Kyoeisha Chemical Co., Ltd.) as the bufunctional acrylic acid ester, and 1,6-hexanediol diacrylate (Product Name: A-HD, manufactured by Shin-Nakamura Chemical Co., Ltd.) as the bifunctional acrylic acid ester.

Furthermore, the neopentylglycol diacrylate (Product Name: A-NPG, manufactured by Shin-Nakamura Chemical Co., Ltd.) as the bifunctional acrylic acid ester, a trimethylolpropane triacrylate (Product Name: A-TMPT, manufactured by Shin-Nakamura Chemical Co., Ltd.) as the bifunctional acrylic acid ester, and an ethoxylated2-methyl-,3-propanediol diacrylate (Product Name: A-IBD-2E, manufactured by Shin-Nakamura Chemical Co., Ltd.) were used as the acrylic acid ester having the branching structure.

Concerning those resin particles, "Compression Load," "Initial Particle Size," "Compression Displacement," "Maximum Compression Deformation Ratio," "Load at a Time of Compression Ratio of 60%" were measured to evaluate the membrane emulsification on the same condition as Embodiment A1 described above. Results of those are described in Table 3 above.

As apparent from Table 3 above, according to Embodiment C1 containing 1,10-decanediol diacrylate of 70 parts by weight having the linear chain structure of the long chain with respect to the acrylic monomer of 100 parts by weight, the maximum compression deformation ratio exceeded 60%, while the load value at a time of the compression ratio of 60% was as small as less than or equal to 30 mN.

To the contrary, according to Comparative Example c1 containing 1,10-decanediol diacrylate of 80 parts by weight, the resin particle itself could not be manufactured since the acrylic monomers were not dispersed in the medium liquid during the process for the membrane emulsification, while Comparative Example c2 having 1,10-decanediol diacrylate of 60 parts by weight had the maximum compression ratio less than 60%.

All of Embodiments C2 to C5 with use of the polytetramethyleneglycol diacrylate as the acrylic acid ester having the linear chain structure of the long chain, had the maximum compression deformation ratios of 60% or more, and especially in Embodiment C2 and Embodiment C3 containing polytetramethyleneglycol diacrylate of 60 or more parts by weight with respect to the acrylic monomer of 100 parts by weight, the load value at a time of the compression ratio of 60% is as extremely small as less than or equal to 30 mN.

Furthermore, as well as the above, according to Embodiment C6 using the acrylic monomers composed of 1,6-hexanediol diacrylate having the linear chain structure of the long chain and Embodiment C7 using the acrylic monomers composed of the ethoxylated2-methyl-1,3-propanediol diacrylate having the branching structure, the maximum compression deformation ratio is 60% or more, while the load value at a time of the compression ratio of 60% is as extremely small as less than or equal to 30 mN.

EMBODIMENT D

The resin particles according to Embodiments D1 to D3, and Comparative Examples d1, d2 were manufactured on the same condition as Embodiment A described above except use of, as the acrylic monomer composition, the acrylic monomer compositions of five kinds composed of a mixture of the bifunctional urethane acrylate serving as the urethane compound and the acrylic acid ester.

Furthermore, as other examples, the resin particle of three kinds were manufactured with use of the acrylic monomer composition composed of a bifunctional (meth)acrylic acid ester, thereby being defined as Embodiments D4 to D6.

Compositions of those acrylic monomer compositions are described in Table 4 below.

TABLE 4

Table 4: Monomer Composition and Measurement Result

| Monomer Compression | Compression Load (mN) | Compression Displacement (μm) | Particle Size (μm) | Compression Deformation Ratio (%) | Load Value at the Time of Compression Ratio of 60% (mN) | |
|---|---|---|---|---|---|---|
| AH600:A-HD = 5:95 | 53.58 | 2.85 | 5.40 | 53 | — | Comparative Example d1 |
| AH600:A-HD = 10:90 | 40.73 | 2.79 | 5.07 | 55 | — | Comparative Example d2 |
| AH600:A-HD = 25:75 | 45.36 | 3.49 | 5.33 | 66 | 31.37 | Embodiment D1 |
| AH600:A-HD = 35:65 | 50.82 | 3.77 | 5.33 | 71 | 25.04 | Embodiment D2 |
| AH600:A-HD = 45:55 | 48.77 | 3.95 | 5.63 | 70 | 23.92 | Embodiment D3 |
| 1,4-BG | 37.72 | 3.41 | 5.23 | 65 | 28.02 | Embodiment D4 |
| A-NPG | 50.11 | 3.72 | 5.50 | 63 | 20.99 | Embodiment D5 |
| NPG | 18.30 | 3.22 | 5.05 | 64 | 11.89 | Embodiment D6 |

* Ratios of the monomer compositions in the above Table are weight ratios of respective monomers.

AH600 as a product name, manufactured by Kkyoeisha Chemical Co., Ltd. was herein used as the bifunctional urethane acrylate. Furthermore, the neopentylglycol (Product Name: A-NPG, manufactured by Shin-Nakamura Chemical Co., Ltd.) defined as the bifunctional acrylic acid ester was used, while 1,4-buthanedial dimethacrylate (Product Name: 1,4-BG, manufactured by Kyoeisha Chemical Co., Ltd.) and a neopentylglycol dimethacrylate (Product Name: NPG, manufactured by Shin-Nakamura Chemical Co., Ltd.) were used as the bifunctional methacrylic acid ester.

As apparent from Table 4 above, according to Embodiments D1 to A3 containing urethane acrylate of 25 or more parts by weight with respect to the acrylic monomer of 100 parts by weight, the maximum compression deformation ratio is 60% or more. Particularly according to the Embodiments D2, D3, in which a containing amount of the urethane acrylate is 35 or more parts by weight, the load at a time of the compression ratio of 60% is as small as less than 30 mN.

According to the Embodiments D4 to D6 using the acrylic monomer not containing the urethane acrylate, the maximum compression deformation ratio is 60% or more while the load at a time of the compression ratio of 60% is less than 30 mN, but compared with the Embodiments D1 to D3 using the urethane acrylate, a value of the compression load when a particle is broken down, tends to be smaller.

while the resin particle (Eposter as a product name, manufactured by Nippon Shokubai Co., Ltd., sold on the market, was herein used) composed of a resin (BG: condensed product of benzoguanamine, melamine, and formanin) other than acrylic resin, formed by means other than the membrane emulsification process, was defined as Comparative Example e8.

Compositions of the acrylic monomers according to the Comparative Examples e1 to e8 are described in Table 5 below.

TABLE 5

Table 5: Monomer Composition and Measurement Result

| Monomer Compression | Compression Load (mN) | Compression Displacement (μm) | Particle Size (μm) | Compression Deformation Ratio (%) | Load Value at the Time of Compression Ratio of 60% (mN) | Membrane Emulsion Tendency | |
|---|---|---|---|---|---|---|---|
| UA-4200:A-HD = 25:75 | 18.2 | 2.43 | 5.33 | 46 | — | A | Comparative Example e1 |
| UA-4400:A-HD = 25:75 | 24.9 | 2.57 | 5.40 | 48 | — | A | Comparative Example e2 |
| UV-7000B:A-HD = 15:85 | 37.48 | 3.31 | 5.81 | 57 | 14.70 | A | Comparative Example e3 |
| UV-7000B:A-HD = 25:75 | 32.31 | 3.21 | 5.35 | 60 | — | C | Comparative Example e4 |
| UV-7000B:A-HD = 35:65 | 37.65 | 3.31 | 5.65 | 59 | — | A | comparative example e5 |
| UA-2BDP:A-HD = 25:75 | 62.80 | 2.82 | 5.23 | 54 | — | B | Comparative Example e6 |
| DVB = 100 | 18.82 | 2.45 | 5.07 | 48 | — | A | Comparative Example e7 |
| BG = 100 | 30.36 | 3.24 | 5.74 | 56 | — | A | Comparative Example e8 |

* Ratios of the monomer compositions in the above Table are weight ratios or respective monomers.

In a comparison between Embodiments A1 to A10 and B1 to B5 described respectively in Table 1 and Table 2 and Embodiments C1 to C6 and D1 and D6 described respectively in Table 3 and Table 4, "Load at a Time of Compression Ratio of 60%" in each of Embodiments C1 to C6 and D1 to D6 is generally less than 30 mN, whereas "Load at a Time of Compression Ratio of 60%" in each of Embodiments A1 to A10 and B1 to B5 is not less than 30 nor more than 60 mN.

According to the above, it turns out that such a resin particle can be compressed and deformed with a small load, as indicated in Embodiment, C1 to C6, using the acrylic monomer containing either or both the acrylic acid ester having the linear chain structure of the long chain and the acrylic acid ester having the branching structure, or as indicated in Embodiments D1 to D6, using the acrylic monomer composed of the mixture of the bifunctional urethane acrylate and the acrylic acid ester or composed of the bifunctional (meth)acrylic acid ester.

COMPARATIVE EXAMPLE E

The resin particles according to Comparative Examples e1 to e6 were manufactured on the same condition as Embodiment A1 described above except use of, as the acrylic monomer, a mixture of the urethane acrylate as an oligomer type or the urethane acrylate as an IPDI (Isophorone Diisocyanate) type and the acrylic acid ester.

Furthermore, as other Comparative Examples, the resin particle composed of a resin (DVB: divinylbenzene) other than the acrylic resin, formed by the membrane emulsification process, was defined as a Comparative Example e7, Herein, UA-4200 as the product name, defined as the bifunctional urethane acrylate of a polyether type, manufactured by Shin-Nakamura Chemical Co., Ltd. as well as UV-7000B as the product name, defined as an oligomer of the bifunctional and trifunctional urethane acrylate, manufactured by Nippon Synthetic Chemical Industry Co., Ltd. were used as the urethane acrylate of the oligomeric type. Furthermore, UA-2BDP as a product name, defined as the bifunctional urethane acrylate, manufactured by Shin-Nakamura Chemical Co., Ltd. was used as the urethane acrylate of the IPDI type.

On the same condition as Embodiment A1 described above, "Compression Load," "Initial Particle Size," "Compression Displacement," "Maximum Compression Deformation Ratio," and "Load at a Time of Compression Ratio of 60%" were measured to evaluate the membrane emulsification upon using the resin particles according to those Comparative Examples e1 to e8.

As obvious from Table 5 above, according to Comparative Examples e1 to e3, e5, and e6, the maximum compression deformation ratio was less than 60%. According to Comparative Example e4, the maximum compression deformation ratio was 60% but droplet diameters formed by the membrane emulsification ware large as well as irregular, so that many particle sizes of the formed resin particles resulted in being of 10 or more μm.

It is turned out according to the above that the urethane acrylate of the oligomer type or of the IPDI type is unsuitable for the resin particle of the present invention.

Furthermore, Comparative Example e7 structured by the resin other than the acrylic resin and Comparative Example e8 formed by the means other than the membrane emulsification process also have the maximum compression deformation ratio less than 60%.

EMBODIMENT F

The conductive particles were manufactured by using, as a core, the resin particles (Embodiments A1 to A10, and Comparative Example a1 and Comparative Example a2) manufactured in Embodiment A, while the anisotropic conductive adhesive (Embodiments F1 to F10, and Comparative Example f1 and Comparative Example f2) containing the above conductive particles were manufactured. The making method was as follows.

The conductive particles were manufactured upon forming a metal coating of Ni (thickness of 0.2 μm) by means of electroless plating on a surface of the resin particle, and thereafter forming a gold coating (thickness of 0.2 μm) by means of electrolytic plating.

On the other hand, insulative adhesive was manufactured by mixing a solid epoxy resin, a liquid epoxy resin, and a latent hardener at proportions of 40 parts by weight, 30 parts by weight, and 30 parts by weight, respectively, and by thereafter mixing a toluene therein.

The above conductive particles were so dispersed in the insulative adhesive as to have a conductive particle's rate of 12 parts by weight, and then the adhesive was coated on a detachable film composed of a polyethylene terephthalate, thereby manufacturing the anisotropic conductive adhesive (ACF) having a dry thickness of 25 μm.

The manufactured anisotropic conductive adhesives were arranged respectively corresponding to respective conductive patterns of the wiring board, thereby being sandwiched and bonded by thermo-compression between two wiring boards. Upon microscopic observation of a coupling portion after the thermo-compression bonding, deformation degree of the conductive particle was evaluated on the following basis. Results are described in Table 6.

Grade A: the conductive particle was completely crushed, so the contact area was extremely large. Additionally, any break in the conductive particle was hardly confirmed.

Grade B: though no break in the conductive particle was confirmed, crush of the conductive particle was insufficient, so the contact area as small.

Grade C: the crush of the conductive particle was insufficient, so the contact area was small. Additionally, the broken conductive particle was confirmed.

TABLE 6

|  | Resin Particle | Compression Deformation Ratio (%) | Load Value at a Time of Compression Ratio of 60% (mN) | Deformation Degree of the Conductive Particle |
|---|---|---|---|---|
| Embodiment F1 | Embodiment A1 | 60 | 44.4 | A |
| Embodiment F2 | Embodiment A2 | 61 | 50.4 | A |
| Embodiment F3 | Embodiment A3 | 60 | 41.7 | A |
| Comparative Example f1 | Comparative Example a1 | 58 | — | C |
| Comparative Example f2 | Comparative Example a2 | 58 | — | C |

TABLE 6-continued

|  | Resin Particle | Compression Deformation Ratio (%) | Load Value at a Time of Compression Ratio of 60% (mN) | Deformation Degree of the Conductive Particle |
|---|---|---|---|---|
| Embodiment F4 | Embodiment A4 | 68 | 37.3 | A |
| Embodiment F5 | Embodiment A5 | 68 | 37.3 | A |
| Embodiment F6 | Embodiment A6 | 60 | 49.2 | A |
| Embodiment F7 | Embodiment A7 | 60 | 49.2 | A |
| Embodiment F8 | Embodiment A8 | 64 | 40.0 | A |
| Embodiment F9 | Embodiment A9 | 60 | 43.8 | A |
| Embodiment F10 | Embodiment A10 | 62 | 39.7 | A |

As apparent from Table 6, Embodiments F1 to F10 using the conductive particles having the Embodiments A1 to A10 as a core respectively could realize a good conductive state. On the other hand, in Comparative Examples f1, f2 using the conductive particles having Comparative Examples a1, a2 as the core respectively, the crush of the conductive particle was insufficient since the maximum compression deformation ratio of the resin particle defined as the core was not enough.

EMBODIMENT G

With use of, as the core, the resin particle (Embodiments B1 to B5, and Comparative Example b1) previously manufactured in Embodiment B, the conductive particle was manufactured in the same way as Embodiment F, while the anisotropic conductive adhesive (Embodiments G1 to G5, and Comparative Example g1) containing the above conductive particles was manufactured.

Each manufactured anisotropic conductive adhesive was arranged corresponding to the conductive pattern of the wiring board, thereby being sandwiched and bonded by the thermo-compression between two wiring boards. Upon microscopic observation of a coupling portion after the thermo-compression bonding, deformation degree of the conductive particle was evaluated in the same way as Embodiment F. Results are described in Table 7.

TABLE 7

|  | Resin Particle | Compression Deformation Ratio (%) | Load Value at a Time of Compression Ratio of 60% (mN) | Deformation Degree of the Conductive Particle |
|---|---|---|---|---|
| Embodiment G1 | Embodiment B1 | 66 | 31.4 | A |
| Embodiment G2 | Embodiment B2 | 67 | 32.1 | A |
| Embodiment G3 | Embodiment B3 | 62 | 49.0 | A |
| Embodiment G4 | Embodiment B4 | 66 | 32 | A |
| Comparative Example g1 | Comparative Example b1 | 56 | — | C |
| Embodiment G5 | Embodiment B5 | 65 | 33.6 | A |

As apparent from Table 7, Embodiments G1 to G5 using the conductive particles having the Embodiments B1 to B5 as the core respectively could realize a good conductive state. On the other hand, in Comparative Example g1 using the conductive particles having Comparative Example b1 as the core, the crush of the conductive particle was insufficient since the maximum compression deformation ratio of the resin particle defined as the core was not enough.

EMBODIMENT H

With use of, as the core, the resin particle (Embodiments C1 to C7, and Comparative Example c2) previously manufactured in Embodiment C, the conductive particle was manufactured in the same way as Embodiment F, while the anisotropic conductive adhesive (Embodiments H1 to H7, and Comparative Example h2) containing the above conductive particles was manufactured.

Each manufactured anisotropic conductive adhesive was arranged corresponding to the conductive pattern of the wiring board, thereby being sandwiched and bonded by the thermo-compression between two wiring boards. Upon microscopic observation of a coupling portion after the thermo-compression bonding, deformation degree of the conductive particle was evaluated in the same way as Embodiment F. Results are described in a Table 8.

TABLE 8

| | Resin Particle | Compression Deformation Ratio (%) | Load Value at a Time of Compression Ratio of 60% (mN) | Deformation Degree of the Conductive Particle |
|---|---|---|---|---|
| Embodiment H1 | Embodiment C1 | 72 | 19.5 | A |
| Comparative Example h2 | Embodiment c2 | 53 | — | C |
| Embodiment H2 | Embodiment C2 | 62 | 28.0 | A |
| Embodiment H3 | Embodiment C3 | 64 | 27.5 | A |
| Embodiment H4 | Embodiment C4 | 64 | 37.8 | A |
| Embodiment H5 | Embodiment C5 | 61 | 41.7 | A |
| Embodiment H6 | Embodiment C6 | 66 | 27.1 | A |
| Embodiment H7 | Embodiment C7 | 64 | 24.4 | A |

As apparent from Table 8, Embodiments H1 to H7 using the conductive particles having Embodiments C1 to C7 as the core respectively could realize a good conductive state. On the other hand, in Comparative Example h2 using the conductive particles having the Comparative Example c2 as the core, the crush of the conductive particle was insufficient since the maximum compression deformation ratio of the resin particle defined as the core was not enough.

EMBODIMENT I

With use of, as the core, the resin particle (Embodiments D1 to D6, and the Comparative Examples d1, d2) previously manufactured in Embodiment D as the core, the conductive particle was manufactured in the same way as Embodiment F, while the anisotropic conductive adhesive (Embodiments I1 to I65, and Comparative Examples i1, i2) containing the above conductive particles was manufactured.

Each manufactured anisotropic conductive adhesive was arranged corresponding to the conductive pattern of the wiring board, thereby being sandwiched and bonded by the thermo-compression between two wiring boards. Upon microscopic observation of a coupling portion after the thermo-compression bonding, deformation degree of the conductive particle was evaluated in the same way as Embodiment F. Results are described in Table 9.

TABLE 9

| | Resin Particle | Compression Deformation Ratio (%) | Load Value at a Time of Compression Ratio of 60% (mN) | Deformation Degree of the Conductive Particle |
|---|---|---|---|---|
| Comparative Example i1 | Embodiment d1 | 53 | — | C |
| Comparative Example i2 | Embodiment d2 | 55 | — | C |
| Embodiment I1 | Embodiment D1 | 66 | 31.37 | A |
| Embodiment I2 | Embodiment D2 | 71 | 25.04 | A |
| Embodiment I3 | Embodiment D3 | 70 | 23.92 | A |
| Embodiment I4 | Embodiment D4 | 65 | 28.02 | A |
| Embodiment I5 | Embodiment D5 | 63 | 20.99 | A |
| Embodiment I6 | Embodiment D6 | 64 | 11.89 | A |

As apparent from Table 9, Embodiments I1 to I6 using the conductive particles having the Embodiments D1 to D6 as the core respectively can realize a good conductive state. On the other hand, in Comparative Example i1, i2 using the conductive particles having the Comparative Examples d1, d2 as the core respectively, the crush of the conductive particle was insufficient since the maximum compression deformation ratio of the resin particle defined as the core was not enough.

COMPARATIVE EXAMPLE J

With use of, as the core, the resin particle (Comparative Examples e1 to e8) previously manufactured in Comparative Example e, the conductive particle was manufactured in the same way as the Embodiment F, while the anisotropic conductive adhesive (Comparative Examples j1 to j8) containing the above conductive particles was manufactured.

Each manufactured anisotropic conductive adhesive was arranged corresponding to the conductive pattern of the wiring board, thereby being sandwiched and bonded by the thermo-compression between two wiring boards. Upon microscopic observation of a coupling portion after the thermo-compression bonding, deformation degree of the conductive particle was evaluated in the same way as Embodiment F. Results are described in Table 10.

TABLE 10

| | Resin Particle | Compression Deformation Ratio (%) | Load Value at a Time of Compression Ratio of 60% (mN) | Deformation Degree of the Conductive Particle |
|---|---|---|---|---|
| Comparative Example j1 | Comparative Example e1 | 46 | — | C |

TABLE 10-continued

|  | Resin Particle | Compression Deformation Ratio (%) | Load Value at a Time of Compression Ratio of 60% (mN) | Deformation Degree of the Conductive Particle |
|---|---|---|---|---|
| Comparative Example j2 | Comparative Example e2 | 48 | — | C |
| Comparative Example j3 | Comparative Example e3 | 57 | — | C |
| Comparative Example j4 | Comparative Example e4 | 60 | 14.70 | C |
| Comparative Example j5 | Comparative Example e5 | 59 | — | C |
| Comparative Example j6 | Comparative Example e6 | 54 | — | D |
| Comparative Example j7 | Comparative Example e7 | 48 | — | C |
| Comparative Example j8 | Comparative Example e8 | 56 | — | C |

In each of Comparative Examples, the crush of the conductive particle was insufficient. Additionally, in Comparative Example j6 using Comparative Example e6 in which the great compression load was necessary for deformation of the resin particle, the break of the conductive particle was observed.

What is claimed is:

1. A method for manufacturing a resin particle including preparing a polymer from monomers including a urethane compound and an acrylic acid ester, comprising the steps of;
    introducing a treatment liquid under pressure into a liquid medium via a porous membrane, said treatment liquid containing said monomers;
    forming a droplet of the treatment liquid in the liquid medium; and
    polymerizing the treatment liquid including the droplet to form the resin particle.

2. The method for manufacturing the resin particle according to claim 1, wherein an acrylic monomer composition added with polymerization initiator is used as the treatment liquid, while water added with a dispersion stabilizer is used as the liquid medium.

3. The method for manufacturing the resin particle according to claim 1, wherein a SPG membrane is used as the porous membrane.

* * * * *